US007306883B2

(12) United States Patent
Ito

(10) Patent No.: US 7,306,883 B2
(45) Date of Patent: *Dec. 11, 2007

(54) COLORED COMPOSITION AND PHOTOSENSITIVE TRANSFER MATERIAL FOR PRODUCING BLACK MATRIX, BLACK MATRIX AND METHOD FOR PRODUCING THE SAME, COLOR FILTER, LIQUID CRYSTAL DISPLAY, AND BLACK MATRIX SUBSTRATE

(75) Inventor: Hideaki Ito, Shizuoka-ken (JP)

(73) Assignee: Fujifilm Corporation, Tokyo (JP)

( * ) Notice: Subject to any disclaimer, the term of this patent is extended or adjusted under 35 U.S.C. 154(b) by 561 days.

This patent is subject to a terminal disclaimer.

(21) Appl. No.: 10/768,664

(22) Filed: Feb. 2, 2004

(65) Prior Publication Data

US 2004/0157141 A1 Aug. 12, 2004

(30) Foreign Application Priority Data

Feb. 4, 2003 (JP) ............................ 2003-027154

(51) Int. Cl.
*G02B 5/20* (2006.01)
*G03F 1/1335* (2006.01)

(52) U.S. Cl. .......................................... 430/7; 349/110

(58) Field of Classification Search ..................... None
See application file for complete search history.

(56) References Cited

U.S. PATENT DOCUMENTS 5,501,900 A * 3/1996 Harada et al. .............. 428/323
5,622,794 A * 4/1997 Sato et al. ...................... 430/7
5,686,980 A * 11/1997 Hirayama et al. .......... 349/110
5,718,992 A * 2/1998 Sato et al. ...................... 430/7
5,916,487 A * 6/1999 Weidlich et al. ............ 252/586
6,057,900 A * 5/2000 Ono et al. .................. 349/110
7,045,257 B2 * 5/2006 Hatakeyama et al. .......... 430/7
7,179,510 B2 * 2/2007 Hatakeyama et al. ........ 428/1.1

FOREIGN PATENT DOCUMENTS

JP 62-9301 A 1/1987
JP 8-021992 A * 1/1996
JP 08-248221 A 9/1996
JP 08-271727 A 10/1996
JP 2000-162427 A 6/2000
JP 3318353 B2 8/2002

OTHER PUBLICATIONS

Semiconductor Equipment and Materials International, Color TFT Liquid Crystal Display, Kyoritsu Shuppan Co., Ltd., Jul. 20, 1996, pp. 218-220.

* cited by examiner

*Primary Examiner*—John A. McPherson
(74) *Attorney, Agent, or Firm*—Sughrue Mion Pllc.

(57) ABSTRACT

A photosensitive or non-photosensitive colored composition for producing a black matrix, containing metal microparticles; a photosensitive transfer material formed from a layer made of the photosensitive colored composition; a black matrix produced by using the colored composition or the photosensitive transfer material; a color filter comprising the black matrix; a liquid crystal display comprising the color filter; and a black matrix substrate comprising a light-transmitting substrate, and a light-shielding layer in which silver microparticles having an average particle diameter of 60 to 250 nm are dispersed.

16 Claims, No Drawings

COLORED COMPOSITION AND PHOTOSENSITIVE TRANSFER MATERIAL FOR PRODUCING BLACK MATRIX, BLACK MATRIX AND METHOD FOR PRODUCING THE SAME, COLOR FILTER, LIQUID CRYSTAL DISPLAY, AND BLACK MATRIX SUBSTRATE

CROSS-REFERENCE TO RELATED APPLICATION

This application claims priority under 35 U.S.C. 119 from Japanese Patent Application No. 2003-27154, the disclosure of which is incorporated by reference herein.

BACKGROUND OF THE INVENTION

1. Field of the Invention

The present invention relates to a colored composition and a photosensitive transfer material for producing a black matrix, a black matrix and a method for producing the same, a color filter, a liquid crystal display, and a black matrix substrate.

2. Description of the Related Art

In color filters used for color liquid crystal displays, red (R), green (G) and blue (B) pixel layers are formed on a transparent substrate, and gaps between the R, G and B pixels are filled with a black matrix for the purpose of improving display contrast or the like. The black matrix must have a high light-shielding property, especially in an active-matrix driving type liquid crystal display using thin-film transistors (TFTs), for the additional purpose of preventing degradation of image quality, which results from leakage of current caused by light from the thin-film transistor.

When, for example, a film of metal such as chromium is used as a light-shielding layer, the black matrix is produced as follows: a thin metal film is produced by a vacuum deposition process or a sputtering process; a photoresist is applied to the thin metal film; the photoresist layer is exposed, by using a photomask having a pattern for the black matrix, and developed; the exposed thin metal film is etched; and the photoresist layer is removed from the thin metal film. (See, for example, pp. 218 to 220 of *Color TFT Liquid Crystal Display*, published by Kyoritsu Shuppan Co., Ltd., Apr. 10, 1997.)

In this method, since a thin metal film is used, a good light-shielding effect is obtained even when the film is very thin. However, this method requires a vacuum film-formation step, such as the vacuum deposition process or sputtering process, and an etching step, and thus, not only are costs increased but also the impact on the environment cannot be ignored. Further, metal film is highly reflective, and thus, display contrast is low under strong outdoor light. With regard to the latter problem, there is a solution in using a low-reflecting chromium film (e.g., a film comprising a chromium metal layer and a chromium oxide layer), however, this inevitably increases costs even more.

Another method for producing the black matrix involves using a photosensitive resin composition containing a light-shielding pigment such as carbon black. An example of this is a self-alignment type method which involves the following: R, G and B pixels are formed on a transparent substrate; a photosensitive resin composition containing carbon black is applied to the pixels; and the entire surface of the photosensitive resin layer is exposed to light from the side of the transparent substrate on which the R, G and B pixels have not been formed (e.g., Japanese Patent Application Laid-Open (JP-A) No. 62-9301).

In this method, the cost of production is lower than that of the former method of etching a metal film, however, in order to obtain a satisfactory degree of light-shielding, the photosensitive resin layer becomes very thick. As a result, overlap of the black matrix and the R, G and B pixels (i.e., difference in level) is caused, and the flatness of the color filter is thereby degraded. This causes cell-gap unevenness in the liquid crystal display, resulting in a defective display having uneven color or the like.

Japanese Patent No. 3,318,353 describes the following method for producing a black matrix in which light-shielding metal particles each having a particle diameter of 0.01 to 0.05 μm are uniformly dispersed: a photosensitive resist layer containing a hydrophilic resin is formed on a transparent substrate, and is then exposed through a photomask having a pattern for the black matrix, and developed, so as to form a relief on the transparent substrate; the transparent substrate is brought into contact with an aqueous solution of a metal compound serving as a catalyst for electroless plating, such that the relief contains the metal compound; the transparent substrate is dried and subjected to heat treatment; and the relief on the transparent substrate is brought into contact with a solution for electroless plating. For the metal particles, this patent discloses possible use of nickel, cobalt, iron, copper and chromium, and as a specific example thereof, only nickel is shown.

However, this method comprises the above-described overly methodical steps of handling aqueous solutions involving forming a relief, including exposure and development; applying a catalyst for electroless plating; heat treatment; and electroless plating. Accordingly, it is difficult to attain production of the black matrix at low cost.

Further, although Japanese Patent No. 3,318,353 does not describe or mention silver at all, there is another problem in that, when the metal particles are silver particles each having a particle diameter of 0.01 to 0.05 μm, unwanted coloring from yellow to red is caused and a proper black cannot be obtained.

Accordingly, there has been need for a colored composition and a photosensitive transfer material, from which a black matrix, which is a thin film and has high light-shielding performance, can be produced at low cost. There has also been need for both a black matrix produced by using the colored composition and a method for producing the same, a color filter and a liquid crystal display provided with the black matrix. There has also been need for a black matrix substrate, which is a thin film and has high light-shielding performance.

SUMMARY OF THE INVENTION

A first aspect of the present invention provides a colored composition for producing a black matrix, containing metal microparticles.

A second aspect of the present invention provides a photosensitive transfer material for producing a black matrix, comprising a support and a photosensitive light-shielding layer, wherein the photosensitive light-shielding layer is made of a photosensitive colored composition for producing a black matrix.

A third aspect of the present invention provides a black matrix comprising a light-shielding layer, the light-shielding layer being made of the colored composition for producing a black matrix according to the first aspect.

A fourth aspect of the present invention provides a black matrix comprising a light-shielding layer, the light-shielding layer being made of the photosensitive transfer material for producing a black matrix according to the second aspect.

A fifth aspect of the present invention provides a color filter comprising two or more groups of pixels on a light-transmitting substrate, the groups of pixels comprising colored layers and having different colors from each other, the pixels being separated from each other by a black matrix, wherein the black matrix is the black matrix according to the third or fourth aspect.

A sixth aspect of the present invention provides a liquid crystal display comprising a color filter, a liquid crystal layer, and a liquid crystal driving means between a pair of substrates, at least one of the substrates having a light-transmitting property, wherein the color filter is the color filter according to the fifth aspect.

A seventh aspect of the present invention provides a liquid crystal display comprising a color filter, a liquid crystal layer, and a liquid crystal driving means between a pair of substrates, at least one of the substrates having a light-transmitting property, wherein the liquid crystal driving means has active elements, and the black matrix according to the third or four aspect is formed between the active elements.

An eighth aspect of the present invention provides a method for producing a black matrix, comprising: forming, on a light-transmitting substrate, a layer made of the photosensitive colored composition for producing a black matrix; exposing the layer through a photomask for the black matrix; and developing the layer.

A ninth aspect of the present invention provides a method for producing a black matrix, comprising: laminating the photosensitive transfer material for producing a black matrix according to the second aspect, which comprises a support and a photosensitive light-shielding layer, on a light-transmitting substrate such that the photosensitive light-shielding layer contacts the light-transmitting substrate; removing the support from the laminate comprising the photosensitive transfer material and the light-transmitting substrate; exposing the photosensitive light-shielding layer through a photomask for the black matrix; and developing the photosensitive light-shielding layer.

A tenth aspect of the present invention provides a black matrix substrate comprising a light-transmitting substrate and a light-shielding layer provided on the light-transmitting substrate, wherein the light-shielding layer is a layer in which silver microparticles having an average particle diameter of 60 to 250 nm are dispersed.

A color filter using the black matrix substrate and a liquid crystal display comprising the color filter are also included within the scope of the present invention.

A black matrix, which is a thin film and has a high optical density, can be produced from the colored composition and the photosensitive transfer material for producing a black matrix according to the present invention. Further, the black matrix of the present invention has a lower reflectance than a black matrix using a thin chromium film. Therefore, a color filter comprising the black matrix of the present invention has a high display contrast and an excellent flatness. Furthermore, a liquid crystal display having the color filter of the present invention does not cause cell-gap unevenness between the color filter and the substrate, and thus does not cause a defective display having uneven color or the like.

DETAILED DESCRIPTION OF THE INVENTION

Colored Composition for Producing Black Matrix

A colored composition for producing a black matrix of the present invention contains metal microparticles, and may further contain a polymer serving as a binder, a solvent or the like.

As the metal microparticles, silver microparticles, gold microparticles, copper microparticles or the like are used. The metal microparticles can be not only commercially obtained but also prepared by chemical reduction of metal ions, electroless plating, evaporation of metal, or the like.

For example, when silver microparticles (colloidal silver) are prepared, the following conventionally known methods can be used: methods in which silver ions are chemically reduced in a solution, e.g., a method disclosed in U.S. Pat. No. 2,688,601 in which a soluble silver salt is reduced by hydroquinone in a gelatin aqueous solution, a method described in German Patent No. 1,096,193 in which a hardly-soluble silver salt is reduced by hydrazine, and a method described in U.S. Pat. No. 2,921,914 in which silver ions are reduced into silver by a tannic acid; a method described in JP-A No. 5-134358 in which silver particles are formed by electroless plating; methods of evaporation in a gas, e.g., a method in which a bulk metal is evaporated in an inert gas such as helium and cold-trapped with a solvent; and the like.

When a light-shielding layer is formed by using the colored composition of the present invention, the optical density per μm of thickness of the light-shielding layer is preferably no less than 1. Further, when a color filter is produced, considering preventing the metal microparticles from fusing at a heating step, the content of the metal microparticles in the colored composition is preferably adjusted so that the content of the metal microparticles in the light-shielding layer to be formed is around 10 to 90% by mass, and preferably around 10 to 80% by mass. (As shown in Examples described later, even when the content of the metal microparticles in the light-shielding layer is not varied, if the average particle diameter of the metal microparticles is varied, obtained optical density is also varied.)

The content of the metal microparticles in a photosensitive colored composition described later is in the same manner.

The average particle diameter of the metal microparticles used for the colored composition of the present invention is preferably 60 to 250 nm from the viewpoint of the optical density (O.D.) of the light-shielding layer. The average particle diameter thereof is more preferably 70 to 200 nm.

The average particle diameter of the metal microparticles in the present invention is an average value of 50 particle diameters measured with a transmission electron microscope (TEM).

Photosensitive Colored Composition for Producing Black Matrix

The colored composition for producing a black matrix in the present invention preferably has photosensitivity. In order to impart the photosensitivity, a photosensitive resin composition is added to the colored composition. As the photosensitive resin composition, those described in paragraphs 0016 to 0022 and 0029 of JP-A No. 10-160926 can be used.

When the metal microparticles are used in the form of a water dispersion as in the above-described case using colloidal silver, an aqueous composition is needed as the photosensitive resin composition. Examples of the photosensitive resin composition include those described in paragraphs 0015 to 0023 of JP-A No. 8-271727, and those obtained commercially, e.g., "SPP-M20" manufactured by Toyo Gosei Co., Ltd.

A black matrix, which is a thin film and has a high optical density, can be produced from the (photosensitive) colored composition for producing a black matrix according to the present invention.

Photosensitive Transfer Material for Producing Black Matrix

In the present invention, a photosensitive transfer material can be produced by using the photosensitive colored composition for producing a black matrix, and a black matrix can be produced by using the photosensitive transfer material.

The photosensitive transfer material is produced by providing, on a support, at least a photosensitive light-shielding layer made of the photosensitive colored composition for producing a black matrix. The thickness of the photosensitive light-shielding layer is preferably around 0.3 to 2.0 μm.

It is preferable that the support is chemically and thermally stable, and is made of a flexible substance. Specifically, the support is preferably a thin sheet of Teflon®, polyethylene terephthalate, polyethylene naphthalate, polyarylate, polycarbonate, polyethylene, polypropylene or the like, or a laminate thereof. Further, in a case in which an alkali-soluble thermoplastic resin layer is provided on the support, it is also preferable that the support can be easily removed from the thermoplastic resin layer. The thickness of the support is preferably 5 to 300 μm, and particularly preferably 20 to 150 μm.

The alkali-soluble thermoplastic resin layer is preferably provided between the support and the photosensitive light-shielding layer.

The substantial softening point of a resin for forming the alkali-soluble thermoplastic resin layer is preferably no higher than 80° C. As the resin for forming the alkali-soluble thermoplastic resin layer, at least one is preferably selected from a saponified product of an ethylene-acrylate copolymer, a saponified product of a styrene-(meth)acrylate copolymer, a saponified product of a vinyltoluene-(meth) acrylate copolymer, and a saponified product of poly(meth) acrylate or a (meth)acrylate copolymer such as a butyl (meth)acrylate-vinyl acetate copolymer. Polymeric organic substances each having a softening point of 80° C. or lower, which are soluble in an alkaline aqueous solution, and described in *Handbook of Plastic Performance* (*Plastic Sein ō Binran*) (edited and written by Japan Plastics Industry Federation and All Japan Plastic Molding Industry Association (Zen-Nippon Plastic Seikei Kōgyō Rengōkai), and published by Kogyo Chosakai Publishing Co., Ltd., Oct. 25, 1968), can also be used. With regard to polymeric organic substances whose softening point is higher than 80° C., the substantial softening point thereof can be decreased to 80° C. or lower by adding, into the polymeric organic substances, various types of plasticizers which are compatible with the polymeric organic substances. Further, in order to adjust the adhesiveness to the support, any polymer, supercooling substance, adhesion modifier or surfactant, mold-releasing agent or the like can be added into the polymeric organic substances within such a range that the substantial softening point thereof does not exceed 80° C. Preferred specific examples of the plasticizer include polypropylene glycol, polyethylene glycol, dioctyl phthalate, diheptyl phthalate, dibutyl phthalate, tricresyl phosphate, cresyl diphenyl phosphate, and biphenyl diphenyl phosphate. The thickness of the thermoplastic resin layer is preferably no less than 6 μm. When the thickness of the thermoplastic resin layer is 5 μm or less, it is difficult to completely absorb unevenness of the base, which is 1 μm or more. The upper limit of the thickness of the thermoplastic resin layer is generally about 100 μm, and preferably about 50 μm, from the viewpoints of developing property and production suitability.

The photosensitive transfer material can be produced by coating a support with a solution of the photosensitive colored composition for producing a black matrix according to the present invention, using a coater such as a spinner, a whirler, a roller coater, a curtain coater, a knife coater, a wire-bar coater, or an extruder, and then by drying the resultant layer. When the alkali-soluble thermoplastic resin layer is provided, the layer can be formed in the same manner.

The photosensitive transfer material of the present invention has the above-described photosensitive light-shielding layer made of the colored composition. Therefore, a black matrix having the light-shielding layer, which is a thin film and has a high optical density, can be produced from the photosensitive transfer material of the present invention.

Black Matrix and Method for Producing the Same

A black matrix of the present invention has a light-shielding layer produced by using the colored composition or the photosensitive transfer material. The thickness of the light-shielding layer is preferably around 0.3 to 2.0 μm. In the light-shielding layer in the black matrix of the present invention, metal microparticles are dispersed, and thus, even when the light-shielding layer is a thin film as described above, it has a satisfactory optical density.

A method for producing the black matrix by using the photosensitive colored composition is as follows: a layer formed by coating a light-transmitting substrate with the photosensitive colored composition containing the metal microparticles (this coating is carried out in the same manner as in production of the photosensitive transfer material) is exposed through a photomask for the black matrix by a general method, and then developed to form the light-shielding layer.

When the colored composition is not photosensitive, a layer made of a photosensitive resin composition which can be developed is formed on a layer formed by coating a light-transmitting substrate with the colored composition containing the metal microparticles, and exposed through a photomask for the black matrix by a general method, and then developed, and the layer of the colored composition is etched to form the light-shielding layer.

A method for producing the black matrix by using the photosensitive transfer material is as follows: the photosensitive transfer material is laminated on a light-transmitting substrate such that the photosensitive light-shielding layer of the photosensitive transfer material contacts the light-transmitting substrate; the support is removed from the laminate comprising the photosensitive transfer material and the light-transmitting substrate; and the photosensitive light-shielding layer is exposed through a photomask for the black matrix, and then developed to form the black matrix.

The method for producing the black matrix according to the present invention does not require complicated steps and can be thereby carried out at lower cost.

Color Filter

A color filter of the present invention has, on a light-transmitting substrate, two or more groups of pixels, which comprise colored layers and have different colors from each other. The pixels are separated from each other by a black matrix. The black matrix is produced by using the colored composition or the photosensitive transfer material for producing a black matrix according to the present invention. The color filter may have two, three, four or more groups of pixels. For example, in the case of three groups of pixels, three hues, i.e., red (R), green (G) and blue (B) hues, are used. In such a case that three types of groups of pixels, i.e., red, green and blue pixels, are arrayed, mosaic-style array, triangle-style array or the like is preferable. In the case in which four or more types of groups of pixels are arrayed, any styles can be used.

As the light-transmitting substrate, known glass plates such as a soda glass plate having a silicon oxide film thereon, a low-expansion glass plate, a non-alkali glass plate, a quartz glass plate and the like, or known plastic films or the like can be used.

In order to produce the color filter, either of the following two methods may be used: the two or more groups of pixels are formed on the light-transmitting substrate by a general method, and thereafter the black matrix is formed in the above-described manner; or the black matrix is formed first, and thereafter the two or more groups of pixels are formed.

Since the color filter of the present invention includes the above-described black matrix, it has a high display contrast and an excellent flatness.

Liquid Crystal Display

One embodiment of a liquid crystal display of the present invention has at least a color filter, a liquid crystal layer, and a liquid crystal driving means (including a simple-matrix driving type and an active-matrix driving type) between a pair of substrates, at least one of which can transmit light, wherein the color filter has the above-described plural groups of pixels, the pixels being separated from each other by the black matrix according to the present invention. Since the color filter has a high flatness, the liquid crystal display having the color filter does not cause cell-gap unevenness between the color filter and the substrate, and thus does not cause a defective display having uneven color or the like.

Another embodiment of a liquid crystal display of the present invention has at least a color filter, a liquid crystal layer, and a liquid crystal driving means between a pair of substrates, at least one of which can transmit light, wherein the liquid crystal driving means has active elements (e.g., TFTs), between which a black matrix is formed by using the colored composition or the photosensitive transfer material for producing a black matrix according to the present invention.

Black Matrix Substrate

A black matrix substrate of the present invention has a light-shielding layer provided on a light-transmitting substrate, wherein silver microparticles having an average particle diameter of 60 to 250 nm are dispersed in the light-shielding layer. When silver microparticles each having a particle diameter of 0.01 to 0.05 μm (10 to 50 nm), which are disclosed in Japanese Patent No. 3,318,353, are used, unnecessary coloring from yellow to red is caused, and a proper black cannot be obtained. However, when silver microparticles each having a particle diameter of 60 to 250 nm and preferably of 70 to 200 nm are used, a sufficient black for the light-shielding layer can be obtained. The black matrix substrate of the present invention can be produced by using the silver microparticles having the average particle diameter of 60 to 250 nm as metal microparticles, in the same manner as in the above-described method for producing a black matrix.

The black matrix substrate of the present invention can be used for producing a color filter.

The thickness of the light-shielding layer in the black matrix substrate is preferably around 0.3 to 2.0 μm. In the light-shielding layer in the black matrix substrate of the present invention, the silver microparticles are dispersed, and thus, even when the light-shielding layer is a thin film as described above, it has a satisfactory optical density.

EXAMPLES

Hereinafter, the present invention will be further specifically described with examples. However, the present invention is not limited to these examples.

Example 1

Method for Producing Black Colloidal Silver

Dispersion liquids, in which silver microparticles were dispersed, were obtained such that the average particle diameter of the silver microparticles of one liquid differed from that of another liquid, by increasing and decreasing the pH of the system when the silver salt was reduced, the density of the gelatin solution, and the amount used of the water-soluble calcium salt, according to Example of U.S. Pat. No. 2,688,601. The content of silver in each of the obtained dispersion liquids was 10% by mass. Then, 100 g of each dispersion liquid, in which the silver microparticles were dispersed, was respectively added into 100 g of 5 mass % aqueous solution containing papain manufactured by Wako Pure Chemical Industries, Ltd., which had been kept at 37° C., so that the gelatin was decomposed by the papain. Thereafter, the mixtures were centrifuged (1,000 rpm for 5 minutes), and the generated supernatant liquids were discarded. Finally, 100 g of water was respectively added to each of the residues, and then the obtained liquids were dispersed with a paint shaker, so as to obtain dispersion liquids in which silver microparticles were dispersed.

Production of Photosensitive Colored Composition 50 g of "SPP-M20" (manufactured by Toyo Gosei Co., Ltd.), which is a photosensitive resin composition, was respectively added to 10.0 g of each of the above-described dispersion liquids in which silver microparticles were dispersed, so as to produce photosensitive colored compositions.

Production of Black Matrix

Each of the photosensitive colored compositions was applied to a glass substrate by using a spin coater, so as to form a photosensitive light-shielding layer having a dry thickness of 0.5 μm.

Then, the photosensitive light-shielding layers were exposed to light at 500 mJ/cm$^2$ by using an ultrahigh pressure mercury lamp. Thereafter, a rinsing process (developing process) was carried out to remove unexposed portions thereof, so as to produce black matrixes on the glass substrates.

The optical densities (O.D.) of the light-shielding layers of the obtained black matrixes are shown in Table 1.

TABLE 1

| Average particle diameter of silver microparticles (nm) | Optical density (O.D.) | Optical density per μm of thickness of Light-shielding layer |
|---|---|---|
| 32 | 1.5 | 3.0 |
| 55 | 2.2 | 4.4 |
| 60 | 2.5 | 5.0 |
| 70 | 2.7 | 5.4 |
| 110 | 3.1 | 6.2 |
| 200 | 3.0 | 6.0 |
| 250 | 2.8 | 5.6 |

Note:
The thickness of each light-shielding layer was 0.5 μm.

As seen from Table 1, even when the light-shielding layer is a thin film having a thickness of 0.5 μm, a black matrix having a high optical density can be obtained from the colored composition for producing a black matrix of the present invention. Further, particularly high optical density can be accomplished when the average particle diameter of the metal microparticles is within a range from 60 to 250 nm, and particularly within a range from 70 to 200 nm.

Example 2

Production of Photosensitive Transfer Material for Producing Black Matrix

Coating solutions each having the following composition were respectively applied to glass substrates and then dried, so as to form alkali-soluble thermoplastic resin layers each having a dry thickness of 20 μm.

| | |
|---|---|
| methyl methacrylate/2-ethylhexyl acrylate/benzyl methacrylate/methacrylic acid copolymer (composition ratio (molar ratio) for copolymerization: 55/11.7/4.5/28.8; weight-average molecular weight: 80,000) | 15.0 parts by mass |
| BPE-500 (multifunctional acrylate manufactured by Shin-Nakamura Chemical Co., Ltd.) | 7.0 parts by mass |
| F177P (fluorinated surfactant manufactured by Dainippon Ink and Chemicals, Incorporated) | 0.3 parts by mass |
| methanol | 30.0 parts by mass |
| methyl ethyl ketone | 19.0 parts by mass |
| 1-methoxy-2-propanol | 10.0 parts by mass |

Next, the photosensitive colored compositions, which were the same as those used in Example 1, were respectively applied to the thermoplastic resin layers by using a spin coater, so as to form photosensitive light-shielding layers each having a dry thickness of 0.5 μm. Then, cover sheets made of polypropylene (each having a thickness of 12 μm) were respectively bonded onto the photosensitive light-shielding layers while pressure was applied to the cover sheets and the photosensitive light-shielding layers, so as to obtain photosensitive transfer materials for producing black matrixes.

The cover sheets of the photosensitive transfer materials were respectively removed therefrom, and thereafter, the photosensitive transfer materials were respectively superimposed on glass substrates such that the photosensitive light-shielding layers contacted the glass substrates. Then, the photosensitive transfer materials and the glass substrates were bonded to each other by pressing (with 0.8 kg/cm$^2$) and heating (at 130° C.) with a laminator (VP-II manufactured by Taisei Laminator Co., Ltd.). Subsequently, the supports and the thermoplastic resin layers were respectively separated from each other to remove the supports.

After that, the photosensitive light-shielding layers were exposed to light at 500 mJ/cm$^2$ by using an ultrahigh pressure mercury lamp. Thereafter, shower development was carried out at 33° C. by using, as a developer, a 1 mass % aqueous solution containing triethanolamine to remove unexposed portions thereof, so as to produce black matrixes on the glass substrates.

The similar optical densities (O.D.) to those in Example 1 were obtained.

What is claimed is:

1. A colored composition for producing a black matrix, the colored composition containing metal microparticles, wherein the metal microparticles are silver microparticles having an average particle diameter of 60 to 250 nm, and when a light-shielding layer is formed using the colored composition, the optical density per μm of thickness of the light-shielding layer is not less than 1.

2. A colored composition for producing a black matrix according to claim 1, wherein the composition is photosensitive.

3. A photosensitive transfer material for producing a black matrix, comprising a support and a photosensitive light-shielding layer, wherein the photosensitive light-shielding layer is made of said colored composition for producing a black matrix according to claim 2.

4. A black matrix comprising a light-shielding layer, the light-shielding layer being made of said photosensitive transfer material for producing a black matrix according to claim 3.

5. A color filter comprising two or more groups of pixels on a light-transmitting substrate, the groups of pixels comprising colored layers and having different colors from each other, the pixels being separated from each other by a black matrix, wherein the black matrix is said black matrix according to claim 4.

6. A liquid crystal display comprising a color filter, a liquid crystal layer, and a liquid crystal driving means between a pair of substrates, at least one of the substrates having a light-transmitting property, wherein the color filter is said color filter according to claim 5.

7. A liquid crystal display comprising a color filter, a liquid crystal layer, and a liquid crystal driving means between a pair of substrates, at least one of the substrates having a light-transmitting property, wherein the liquid crystal driving means has active elements, and said black matrix according to claim 4 is formed between the active elements.

8. A black matrix comprising a light-shielding layer, the light-shielding layer being made of said colored composition for producing a black matrix according to claim 1.

9. A color filter comprising two or more groups of pixels on a light-transmitting substrate, the groups of pixels comprising colored layers and having different colors from each other, the pixels being separated from each other by a black matrix, wherein the black matrix is said black matrix according to claim 8.

10. A liquid crystal display comprising a color filter, a liquid crystal layer, and a liquid crystal driving means between a pair of substrates, at least one of the substrates having a light-transmitting property, wherein the color filter is said color filter according to claim 9.

11. A liquid crystal display comprising a color filter, a liquid crystal layer, and a liquid crystal driving means between a pair of substrates, at least one of the substrates having a light-transmitting property, wherein the liquid crystal driving means has active elements, and said black matrix according to claim 8 is formed between the active elements.

12. A colored composition for producing a black matrix according to claim 1, wherein the content of the metal microparticles in the light-shielding layer is 10 to 90% by mass.

13. A method for producing a black matrix, comprising:

preparing a colored composition using metal microparticles having an average particle diameter of 60 to 250 nm;

forming, on a light-transmitting substrate, a layer made of said colored composition;

exposing the layer through a photomask for the black matrix; and developing the layer wherein an optical density per μm of thickness of the developed layer is not less than 1.

14. A method for producing a black matrix according to claim 13, wherein forming the layer made of the colored composition comprises:

laminating a photosensitive transfer material for producing a black matrix, which comprises a support and a photosensitive light-shielding layer, on a light-transmitting substrate such that the photosensitive light-shielding layer contacts the light-transmitting substrate, wherein the photosensitive light-shielding layer is made of the colored composition; and removing the support from the laminate comprising the photosensitive transfer material and the light-transmitting substrate.

15. A method for producing a black matrix according to claim 13, wherein the content of the metal microparticles in the black matrix is 10 to 90% by mass.

16. A black matrix substrate comprising a light-transmitting substrate and a light-shielding layer provided on the light-transmitting substrate, wherein the light-shielding layer is a layer in which silver microparticles having an average particle diameter of 60 to 250 nm are dispersed.

* * * * *